United States Patent
Huang (10) Patent No.: US 11,966,128 B2
(45) Date of Patent: Apr. 23, 2024

(54) DISPLAY PANEL STATIC ELECTRICITY PROTECTION DEVICE, STATIC ELECTRICITY PROTECTION METHOD, AND DISPLAY DEVICE

(71) Applicant: HKC CORPORATION LIMITED, Shenzhen (CN)

(72) Inventor: Xiaoyu Huang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 432 days.

(21) Appl. No.: 17/288,007

(22) PCT Filed: Mar. 6, 2020

(86) PCT No.: PCT/CN2020/078099
§ 371 (c)(1),
(2) Date: Apr. 23, 2021

(87) PCT Pub. No.: WO2020/182063
PCT Pub. Date: Sep. 17, 2020

(65) Prior Publication Data
US 2021/0397053 A1    Dec. 23, 2021

(30) Foreign Application Priority Data
Mar. 13, 2019    (CN) .......................... 201910187676.9

(51) Int. Cl.
*G02F 1/1362*    (2006.01)
*G02F 1/1345*    (2006.01)
(Continued)

(52) U.S. Cl.
CPC .... *G02F 1/136204* (2013.01); *G02F 1/13452* (2013.01); *G02F 1/1368* (2013.01); *H02H 9/02* (2013.01)

(58) Field of Classification Search
CPC .......... G02F 1/136204; G02F 1/13452; G02F 1/1368; H02H 9/02; H02H 9/046;
(Continued)

(56) References Cited

U.S. PATENT DOCUMENTS 6,898,061 B1 *    5/2005    Kimber .............. H03K 17/0826
361/56
7,593,204 B1 *    9/2009    Iversen .................. H02H 9/046
361/56
(Continued)

FOREIGN PATENT DOCUMENTS

CN    203705591 U    7/2014
CN    107369672 A    11/2017
(Continued)

OTHER PUBLICATIONS

Li Q; Electrostatic discharge protection circuit of power chip; Date: Nov. 15, 2006; specification and drawings (Year: 2006).*
(Continued)

*Primary Examiner* — Dharti H Patel (57) ABSTRACT

The present disclosure provides a display panel static electricity protection device (400), static electricity protection method, and a display device (100), including a detection sub-circuit (401), a detection sub-circuit (401), a discharge circuit (402) connected with the driving chip (301), a current driving sub-circuit (403) connected with the detection sub-circuit (401), the discharge circuit (402), and a discharge terminal (404), and the discharge terminal (404) connected with a grounding wire of the driving circuit board. The detection sub-circuit (401) detects static electricity, the current driving sub-circuit (403) inputs and detects current in the detection sub-circuit (401) to open or close the discharge circuit (402). The static electricity is discharged to the
(Continued)

discharge terminal (404) through the discharge circuit (402) and the current driving sub-circuit (403).

15 Claims, 3 Drawing Sheets

(51) Int. Cl.
*G02F 1/1368* (2006.01)
*H02H 9/02* (2006.01)

(58) Field of Classification Search
CPC ............ G09G 3/3648; G09G 2330/04; G09G 2330/06; H01L 27/0285; H01L 27/0296; H01L 27/0266
USPC .......................................................... 361/56
See application file for complete search history.

(56) References Cited

U.S. PATENT DOCUMENTS

| | | | | |
|---|---|---|---|---|
| 8,537,517 | B1* | 9/2013 | Banak .................... | H02H 9/025 |
| | | | | 361/93.1 |
| 8,659,859 | B1 | 2/2014 | Zhu et al. | |
| 9,705,307 | B2* | 7/2017 | Ji ............................ | H02H 3/18 |
| 10,608,429 | B2* | 3/2020 | Tsaur ...................... | H02H 9/04 |
| 11,644,497 | B2* | 5/2023 | O'Donnell .......... | H02J 7/00032 |
| | | | | 340/653 |
| 2002/0093360 | A1* | 7/2002 | Nagata ................ | G01R 31/2884 |
| | | | | 361/86 |
| 2009/0080128 | A1* | 3/2009 | Tsuchihashi ........ | H01L 27/0259 |
| | | | | 361/56 |
| 2014/0146426 | A1* | 5/2014 | Murakami ........ | G02F 1/136204 |
| | | | | 361/56 |

FOREIGN PATENT DOCUMENTS

| | | | | |
|---|---|---|---|---|
| CN | 107705742 | A | | 2/2018 |
| CN | 109461422 | A | | 3/2019 |
| CN | 109950885 | A | | 6/2019 |
| CN | 111739458 | A * | 10/2020 | ............... G09G 3/20 |
| CN | 113721123 | A * | 11/2021 | |
| CN | 217935448 | U * | 11/2022 | |
| DE | 102015118210 | A1 * | 5/2016 | ......... G01R 19/0092 |

OTHER PUBLICATIONS

Lu Li, the International Searching Authority written comments, dated Jun. 2020, CN.
Lu Li, the International Searching Report, dated Jun. 2020, CN.

* cited by examiner

DISPLAY PANEL STATIC ELECTRICITY PROTECTION DEVICE, STATIC ELECTRICITY PROTECTION METHOD, AND DISPLAY DEVICE

CROSS-REFERENCE TO RELATED APPLICATIONS

This application claims priority to the Chinese Patent Application No. CN 201910187676.9, filed with National Intellectual Property Administration, PRC on Mar. 13, 2019 and entitled "DISPLAY PANEL STATIC ELECTRICITY PROTECTION DEVICE, DISPLAY PANEL STATIC ELECTRICITY PROTECTION METHOD, AND DISPLAY DEVICE", which is incorporated herein by reference in its entirety.

TECHNICAL FIELD

The present disclosure relates to a field of display technology, and in particular to a display panel static electricity protection device, static electricity protection method, and a display device.

BACKGROUND

Statements herein merely provide background information related to the present disclosure and do not necessarily constitute prior art.

Display panels are one of main varieties of present flat panel displays, and have become an important display platform in modern video products. Main driving principle of the display panels are as follows: a system mainboard connects red (R), green (G), blue (B) compressed signals, control signals, and power with electronic connectors on a printed circuit board through wires, data processed by a driving chip on the printed circuit board, passing through the printed circuit board, is connected with a display area through Source-Chip on Film (S-COF) and Gate-Chip on Film (G-COF), so that a liquid crystal display obtains required power and signals.

Static electricity protection device on the printed circuit board can be burnt due to continuous static electricity discharge of energy and cannot continue to perform static electricity discharge protection.

SUMMARY

In view of above, the present disclosure provides a display panel static electricity protection device, static electricity protection method, and a display device.

To achieve above objects, the present disclosure provides a display panel static electricity protection device, including a detection sub-circuit, a discharge circuit, a current driving sub-circuit, and a discharge terminal. The detection sub-circuit is connected with a driving chip of a display panel. The discharge circuit is connected with the detection sub-circuit and the discharge circuit. The detection sub-circuit is configured to detect static electricity, the current driving sub-circuit is configured to output and detect a current in the detection sub-circuit to open or close the discharge circuit. Based on driving the discharge circuit to open or close through the current, the static electricity is discharged to the discharge terminal through the discharge circuit and the current driving sub-circuit.

The present disclosure further provides a display panel static electricity protection method, including a display panel static electricity protection device. The display panel static electricity protection device includes a detection sub-circuit connected with a driving chip of a display panel, a discharge circuit connected with the detection sub-circuit and the driving chip, a current driving sub-circuit connected with the detection sub-circuit and the discharge circuit, and a discharge terminal connected with the discharge circuit and the current driving sub-circuit. The display panel static electricity protection method includes steps:
  detecting whether an output terminal of the driving chip has static electricity by the detection sub-circuit;
  opening the discharge circuit if the output terminal of the driving chip has the static electricity; and
  closing the discharge circuit if the output terminal of the driving chip has none of the static electricity.

The present disclosure further provides a display device, including a display panel, a driving circuit board, and a static electricity protection device. The static electricity protection device includes a detection sub-circuit connected with a driving chip of the display panel, a discharge circuit connected with the detection circuit and the driving chip, a current driving sub-circuit connected with the detection sub-circuit and the discharge circuit, and a discharge terminal connected with the discharge circuit and the current driving sub-circuit. The detection sub-circuit is configured to detect static electricity, the current driving sub-circuit is configured to output and detect a current in the detection sub-circuit to open or close the discharge circuit. The static electricity is discharged to the discharge terminal through the discharge circuit and the current driving sub-circuit. The driving circuit board is connected with the display panel, and the static electricity protection device is disposed on the driving circuit board.

As opposed to a reverse diode only scheme, the detection sub-circuit of the present disclosure is configured to detect the static electricity. When a certain static electricity is generated at an output terminal of the driving chip, the detection sub-circuit detects the static electricity from the output terminal of the driving chip and the current driving sub-circuit detects the current in the detection sub-circuit, based on driving the discharge circuit to open or close through the current, the driving chip, the discharge circuit, and the discharge terminal are temporarily conducted, the static electricity is discharged from the driving chip to the discharge terminal through the discharge circuit, at this time, the static electricity is discharged to the discharge terminal through the current driving sub-circuit. After static electricity is completely discharged, the current driving sub-circuit reacts to close the discharge circuit, so that the driving chip and the discharge terminal are disconnected. Overload capacity of the discharge circuit is greater than that of the reverse diode and an electronic static discharge has a plurality of ways, thus, even though high-energy or continuous electronic static discharge happens, the display panel static electricity protection device does not be damaged, which improves protection performance and reliability of the static electricity protection device.

BRIEF DESCRIPTION OF DRAWINGS

The drawings are included to provide a further understanding of embodiments of the present disclosure, which form portions of the specification and are used to illustrate implementation manners of the present disclosure and are intended to illustrate operating principles of the present disclosure together with the description. Apparently, the drawings in the following description are merely some of the embodiments of the present disclosure, and those skilled in the art are able to obtain other drawings according to the drawings without contributing any inventive labor. In the drawing.

DETAILED DESCRIPTION OF EMBODIMENTS

Specific structure and function details disclosed herein are only representative and are used for the purpose of describing exemplary embodiments of the present disclosure. However, the present disclosure may be achieved in many alternative forms and shall not be interpreted to be only limited to the embodiments described herein.

It should be understood in the description of the present disclosure that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure. In addition, the terms such as "first" and "second" are only used for the purpose of description, rather than being understood to indicate or imply relative importance or hint the number of indicated technical features. Thus, the features limited by "first" and "second" can explicitly or implicitly include one or more features. In the description of the present disclosure, the meaning of "a plurality of" is two or more unless otherwise specified. In addition, the term "include" and any variant are intended to cover non-exclusive inclusion.

It should be noted in the description of the present disclosure that, unless otherwise regulated and defined, terms such as "installation", "bonded", and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two elements. For those of ordinary skill in the art, the meanings of the above terms in the present disclosure may be understood according to concrete conditions.

The terms used herein are intended to merely describe concrete embodiments, not to limit the exemplary embodiments. Unless otherwise noted clearly in the context, singular forms "one" and "single" used herein are also intended to include plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

In the drawings, similar structures are indicated by identical labels.

Figure 1:
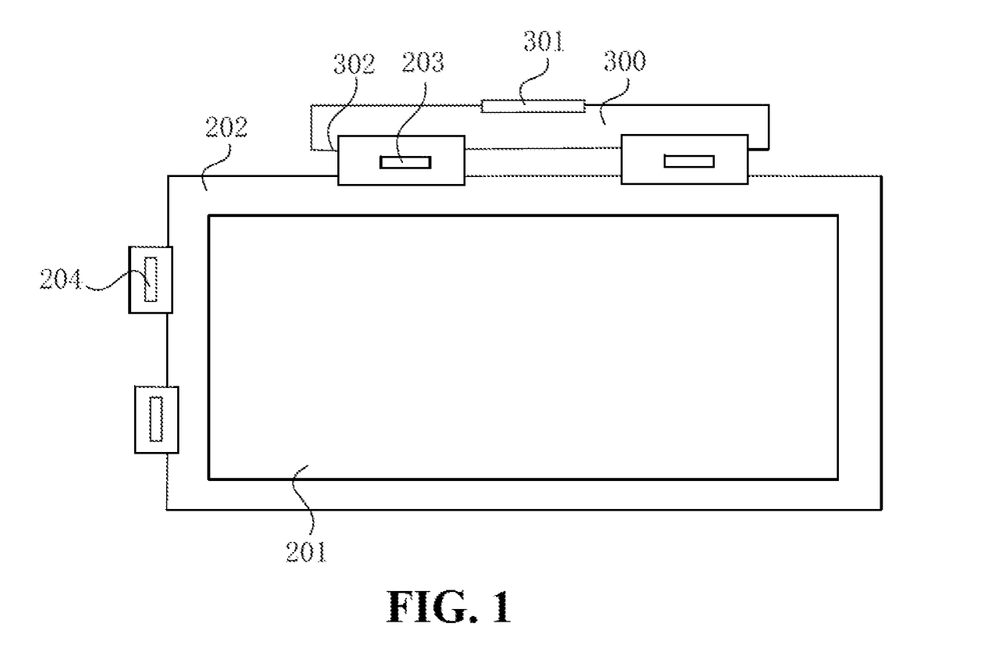
FIG. 1 is a schematic diagram of an exemplary display device according of the present disclosure.

As shown in FIG. 1, Thin Film Transistor Liquid Crystal Display (TFT-LCD) is one of main varieties of present flat panel display, and becomes an important display platform in modern Information Technology (IT) and video products. Main driving principle of the TFT-LCD are as follows: a system mainboard connects red (R), green (G), blue (B) compressed signals, control signals, and power with electronic connectors 302 on a Printed Circuit Board (PCB) 300 through wires, data processed by a timing controller (TCON) and an integrated circuit (IC) on the printed circuit board, passing through the printed circuit board, is connected with a display area 201 through Source-Chip on Film (S-COF) 203 and Gate-Chip on Film (G-COF) 204, so that Liquid Crystal Display (LCD) obtains required power and signals.

Figure 2:
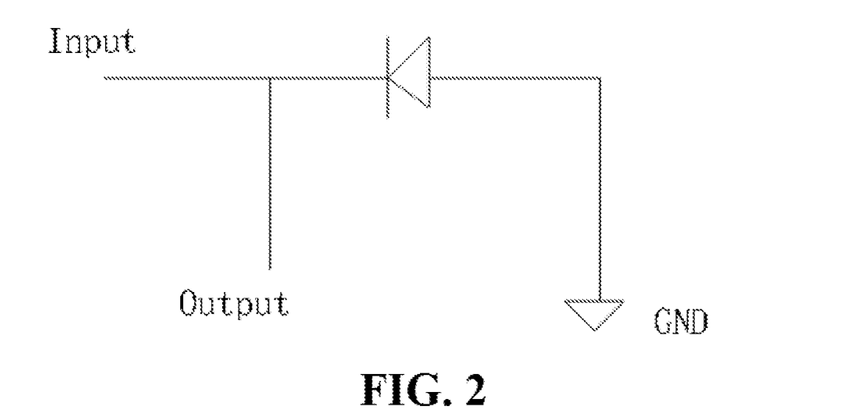
FIG. 2 is a schematic diagram of an exemplary reverse diode static electricity protection device of the present disclosure.

As users' requirements for product reliability continue to improve, and requirements for product quality continue to be stringent, protection level and reliability requirements of Electronic Static Discharge (ESD) are increasingly high. As shown in FIG. 2, a method of ESD protection is achieved by a reverse diode. When high-energy or continuous electronic static discharge happens, the reverse diode is damaged, so that ESD protection cannot continue.

The present disclosure is further described below with reference to the accompanying drawings and optional embodiments.

Figure 3:
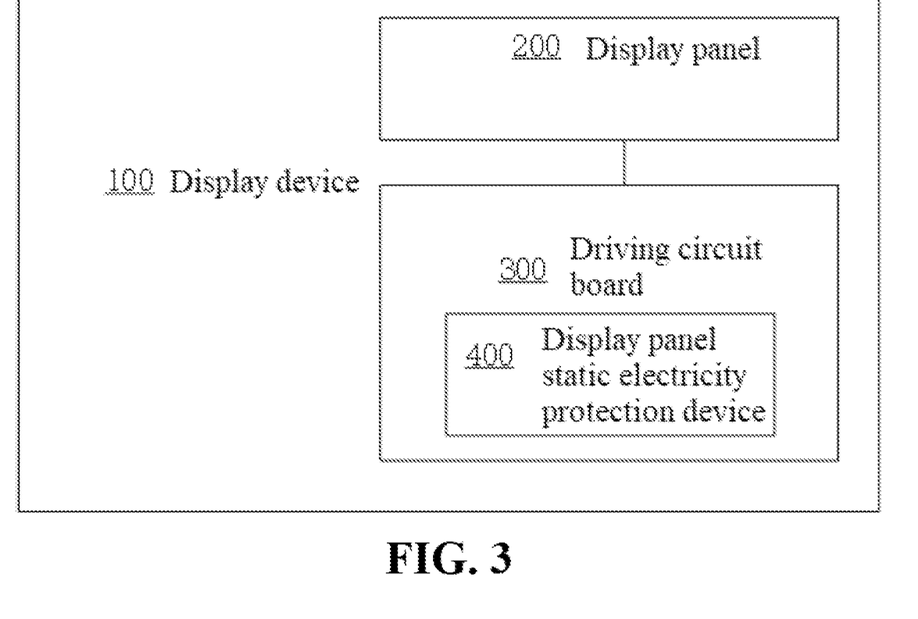
FIG. 3 is a schematic diagram of a display device according to one embodiment of the present disclosure.

As shown in FIGS. 1 and 3, the present disclosure provides a display device 100, including a display panel 200, a driving circuit board 300, and a static electricity protection device of the display panel 400 shown below.

The display panel 200 includes a display area 201, a non-display area 202, a source electrode thin film driving chip 203, and a gate electrode thin film driving chip 204. The driving circuit board 300 includes a driving chip 301 and a connector 302. The driving circuit board 300 is connected with the display panel 200, the non-display area 202 surrounds the display area 201, the display area 201 is configured to display pictures, the non-display area 202 is connected with the source electrode thin film driving chip 203 and the gate electrode thin film driving chip 204, the source electrode thin film driving chip 203 is connected with the connector 302, the connector 302 is connected with the driving chip 204. Signals and power within the driving circuit board 300 are transmitted to the display area 201 through the connector 302, the source electrode thin film driving chip 203, the gate electrode thin film driving chip 204, and some wires.

Figure 4:
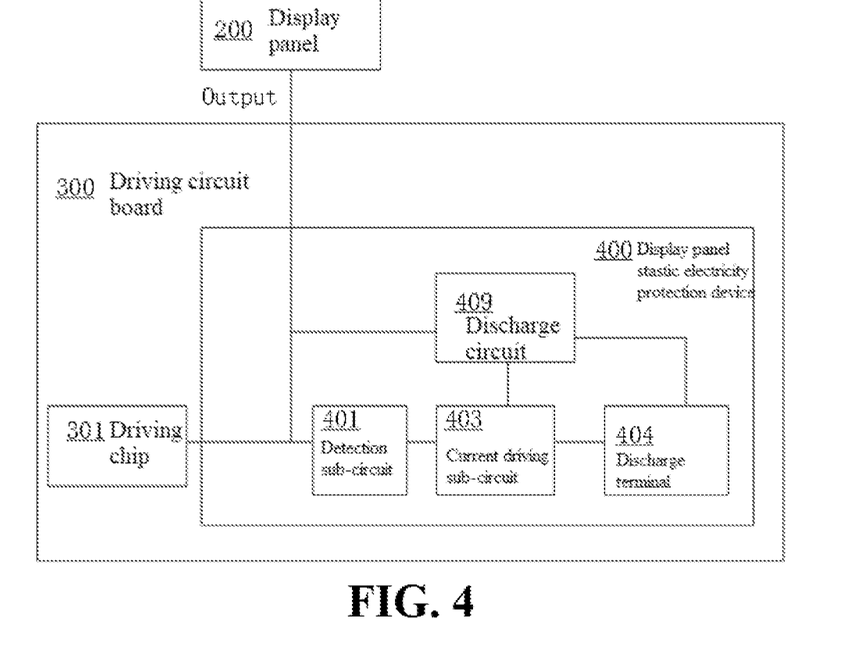
FIG. 4 is a schematic diagram of a detection sub-circuit, a current driving sub-circuit, and a discharge circuit according to one embodiment of the present disclosure.

As shown in FIG. 4, the present disclosure provides a display panel static electricity protection device 400, including a detection sub-circuit 401, a discharge circuit 402, a current driving sub-circuit 403, and a discharge terminal 404. The detection circuit 401 is connected with a driving chip 301 of the display panel 200, the discharge circuit 402 is connected with the detection sub-circuit 401 and the driving chip 301, the current driving sub-circuit 403 is connected with the detection sub-circuit 401, the discharge circuit 402, and the discharge terminal 404, the discharge terminal 404 is connected with the discharge circuit 402, and the discharge terminal 44 is normally connected with a grounding wire of the driving circuit board 300.

The detection sub-circuit 401 is configured to detect the static electricity, the current driving sub-circuit 403 is configured to output and detect a current in the detection sub-circuit 401, based on driving the discharge circuit 403 to open or close through the current, the static electricity is discharged to the discharge terminal 404 through the discharge circuit 402 and the current driving sub-circuit 403. When a certain static electricity is generated at an output terminal of the driving chip 301, the detection sub-circuit 401 detects the static electricity from the output terminal of the driving chip 301 and the current driving sub-circuit 403 detects the current in the detection sub-circuit 401, based on driving the discharge circuit 402 to open or close through the current, the driving chip 301, the discharge circuit 402, and the discharge terminal 404 are temporarily conducted, the static electricity is discharged from the driving chip 301 to the discharge terminal 404 through the discharge circuit 402, at this time, the static electricity is discharged to the discharge terminal 404 through the current driving sub-circuit 403. After static electricity is completely discharged, the current driving sub-circuit 403 reacts to close the discharge circuit 402, so that the driving chip 301 and the discharge terminal 402 are disconnected.

Overload capacity of the discharge circuit 402 is greater than that of a reverse diode D2 and an electronic static discharge has a plurality of ways, thus, even though high-energy or continuous electronic static discharge happens, the display panel 200 static electricity protection device does not be damaged, which improves protection performance and reliability of the static electricity protection device.

In one embodiment, the driving chip 301 is a timing controller chip or a power chip. The timing controller chip transmits data signals to the display panel through the connector, the power chip transmits power to the display panel 200 through the connector. During a transmission process, the high-energy or continuous static electricity may be generated, so that a stable static electricity protection device needs to be disposed. The static electricity protection device is connected with the timing controller chip and the connector, and the static electricity protection device is further connected with the power chip and the connector.

Figure 5:
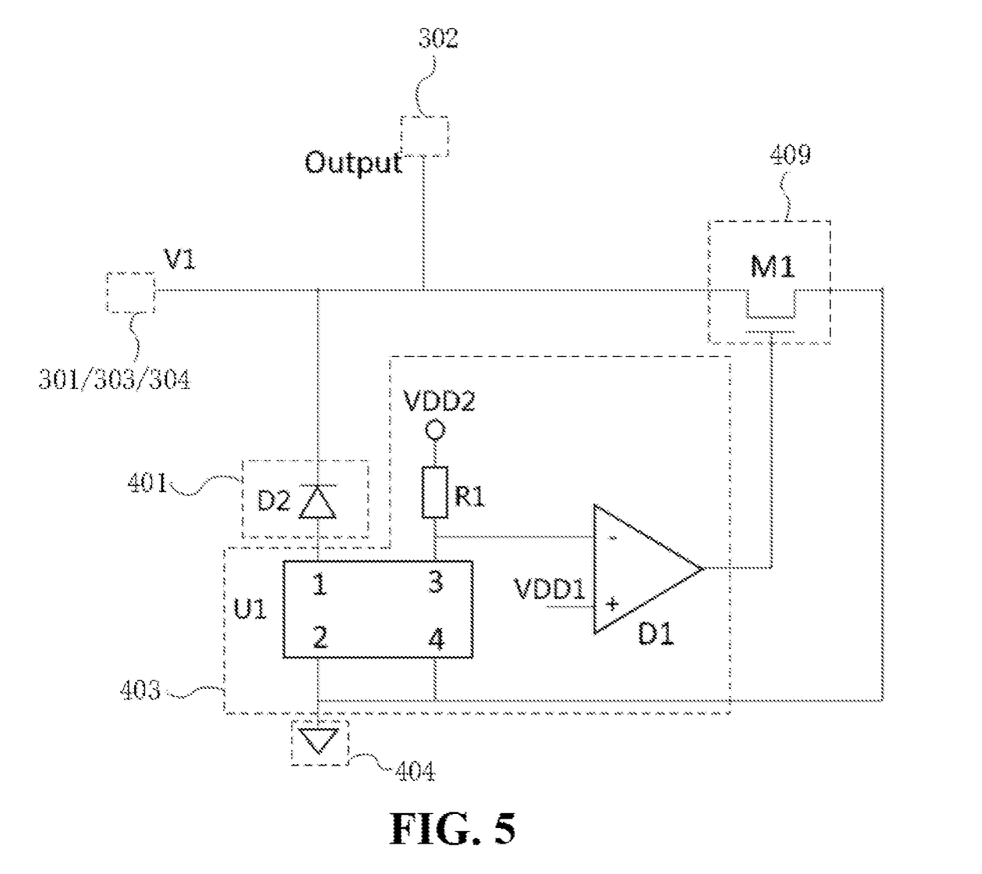
FIG. 5 is a schematic diagram of a static electricity protection device according to one embodiment of the present disclosure.

Specifically, as shown in FIG. 5, the detection sub-circuit includes the reverse diode D2, a cathode of the reverse diode D2 is connected with the driving chip, an anode of the reverse diode D2 is connected with the current driving sub-circuit. A breakdown voltage value of the reverse diode D2 is greater than a maximum operating voltage of the driving chip. In order to ensure that the reverse diode D2 does not conduct in absence of static electricity to trigger the current driving sub-circuit, and the static electricity is discharged when the static electricity generates at the identical time. The breakdown voltage value of the backward diode D2 is between 1.05 and 1.2 times the maximum operating voltage value of the driving chip.

Using the breakdown voltage value of the reverse diode D2 as a threshold voltage for static electricity determination does not affect normal operation of circuits under normal conditions. When the static electricity is too high or continuous, the reverse diode D2 is temporarily conducted to trigger the discharge circuit to discharge, moreover, the reverse diode D2 discharge a certain amount of the static electricity, partly undertakes the static electricity discharging for conduction to be a trigger signal to trigger the current driving sub-circuit to open the discharge circuit. After the static electricity is discharged, the reverse diode D2 and the discharge circuit are both in a close state, and the reverse diode D2 continues to be used to prevent the high-energy and continuous static electricity next time.

The current driving sub-circuit includes a current follower U1, a comparator D1, and a first resistor R1. A primary side is an input branch of the current follower U1, and a secondary side is an output branch of the current follower U1. Static electricity passing through the detection sub-circuit 401 mainly passes through the primary side of the current follower, the secondary side of the current follower is disposed with respect to the primary side, the secondary side senses the primary side and generates current. A first pin corresponding to the primary side of the current follower U1 is connected with the detection sub-circuit 401, a second pin corresponding to the primary side is connected with the discharge terminal 40. A third pin corresponding to the secondary side of the current follower U1 is connected with both the first resistor R1 and a reverse input terminal of the comparator D1, a fourth pin corresponding to the secondary side of the current follower U1 is connected with the discharge terminal 404. A same-direction input terminal of the comparator D1 is connected with a first logic high voltage VDD1, the reverse input terminal of the comparator D1 is connected with a second logic high voltage VDD2 through the first resistor R1. An output terminal of the comparator D1 is connected with a control terminal of the discharge circuit 402. The detection sub-circuit includes the reverse diode D2, a cathode of the reverse diode D2 is connected with the driving chip, and an anode of the reverse diode is connected with the first pin corresponding to the primary side of the current follower U1.

When voltage of the same-direction input terminal of the comparator D1 is greater than voltage of the reverse input terminal of the comparator D1, the output terminal of the comparator D1 outputs a high level. When the voltage of the same-direction input terminal of the comparator D1 is lower than or equal to the voltage of the reverse input terminal of the comparator D1, the output terminal of the comparator D1 outputs a low level. A voltage value of the first logic high voltage VDD1 is equal to a voltage value of the second logic high voltage VDD2.

When the reverse diode D2 is broken down to pass through partial current, the current passes through the first pin 1 and the second pin 2 corresponding to the primary side of the current follower U1, the current in the first pin 1 and the second pin 2 is increased, at this time, the current in the third pin 3 and the fourth pin is increased, the current comes from nothing, then the current is also generated on the first resistor R1 connected with the second logic high voltage VDD2, and a voltage drop on the first resistor R1 is a product of a current value of the third pin 3 and a resistance value of the first resistor R1, at this time, an input voltage value on the reverse input terminal of the comparator D1 is VVDD2−R1*I34, an input voltage value on the same-direction input terminal of the comparator D1 is VVDD1, a voltage value of the first logic high voltage VDD1 and a voltage value of the second logic high voltage VDD2 are equal to improve sensitivity of the comparator D1, the input voltage value on the reverse input terminal of the comparator D1 is lower than the input voltage value on the same-direction input terminal of the comparator D1, the output terminal of the comparator D1 outputs a high level and is configured to turn on the control terminal of the discharge circuit, and the static electricity energy is discharged to the grounding wire through the input terminal and the output terminal of the discharge circuit. Meanwhile, there are partial currents being discharged to the grounding wire through the reverse diode D2, the first pin corresponding to the primary side of the current follower U1, and the second pin corresponding to the primary side of the current follower U1. The static electricity is discharged two-way, the static electricity energy is discharged in multiple ways, so that a large amount of the static electricity can be discharged, when the static electricity energy is discharged to a certain extent, the reverse diode D2 cannot pass static electricity. The currents in the first pin 1 and the second pin2 are zero, correspondingly, the currents in the third pin 3 and the fourth pin are also zero, there is no current passing through the first resistor R1, thus, there is no voltage drop. The input voltage value on the reverse input terminal of the comparator D1 is VVDD2, the input voltage value on the same-direction input terminal of the comparator D1 is VVDD1, VVDD2=VVDD1, the output terminal of the comparator D1 outputs a low level, the control terminal of the discharge circuit is turned off, thus the operating current does not pass through the discharge circuit, waiting for next high-energy static electricity generation, an N-type Metal Oxide Semi-con-Ductor (MOS) transistor still turns on and off to provide stable and continuous static electricity protection for the driving chip.

The current follower U1 is similar to a transformer, the first pin 1 and the second pin 2 of the current follower U1 are in communication, the third pin 3 and the fourth pin are in communication, when the current passing through the first pin 1 and the second pin 2 is increased, the current passing through the third pin 3 and the fourth pin is also increased, moreover, a magnitude relationship between the current passing through the first pin 1 and the second pin 2 and the current passing through the third pin 3 and the fourth pin 4 is directly proportional, which relationship is I12=A*I34, where A is a fixed value, when a is greater than one, the current in the third pin is less than the current in the first pin, thereby reducing a trigger current, and power of the current driving sub-circuit is further reduced. Certainly, the a may also be smaller than one so that the current is amplified, if a current passing through the first pin 1 is too small, the comparator D1 may make accurate reaction through the amplified current, and precision is further improved.

In one embodiment, the discharge circuit includes a semiconductor field effect transistor M1. An input terminal of the semiconductor filed effect transistor M1 is connected with the driving chip, a control terminal of the semiconductor filed effect transistor M1 is connected with the current driving sub-circuit, and an output terminal of the semiconductor field effect transistor M1 is connected with the grounding wire.

The semiconductor filed effect transistor M1 has a role of a switch, overload capacity of the semiconductor filed effect transistor M1 is greater than the reverse diode D2, and the semiconductor filed effect transistor M1 can be triggered by the current driving sub-circuit to turn on or off, the semiconductor filed effect transistor M1 turns on when the static electricity needs to be discharged and turns off when the static electricity has no need to be discharged.

The semiconductor filed effect transistor M1 is the N-type MOS transistor or a P-type MOS transistor, the N-type MOS transistor turns on when a control terminal signal is high and turns off when the control signal is low, the P-type MOS transistor turns on when the control terminal signal is low and turns off when the control signal is high.

As shown in FIGS. 4-5, in one embodiment, the present disclosure provides a display panel 200 static electricity protection device, including a sub-circuit 401, a discharge circuit 402, a current driving sub-circuit 403, and a discharge terminal 404. The detection circuit 401 is connected with a driving chip 301 of the display panel 200, the discharge circuit 402 is connected with the detection sub-circuit 401 and the driving chip 301, the current driving sub-circuit 403 is connected with the detection sub-circuit 401, the discharge circuit 402, and the discharge terminal 404, the discharge terminal 404 is connected with the discharge circuit 402.

The detection sub-circuit 401 includes a reverse diode D2, the discharge circuit 402 includes an N-type MOS transistor, the current driving sub-circuit 403 includes a current follower U1, a comparator D1, and a first resistor R1. The comparator D1 includes a same-direction input terminal and a reverse input terminal, the driving chip 301 includes a timing controller chip 303 or a power chip 304, the discharge terminal 404 includes a grounding wire.

A cathode of the reverse diode D2 is connected with the driving chip 301, an anode of the reverse diode D2 is connected with a first pin 1 corresponding to a primary side of the current follower U1, a second pin 2 corresponding to the primary side of the current follower U1 is connected with the grounding wire, a third pin corresponding to a secondary side of the current follower U1 is connected with both the first resistor R1 and a reverse input terminal of the comparator D1, a fourth pin corresponding to the secondary side of the current follower U1 is connected with the grounding wire. The reverse input terminal of the comparator D1 is connected with a second logic high voltage VDD2 through the first resistor R1, a same-direction input terminal of the comparator D1 is connected with a first logic high voltage VDD1. An output terminal of the comparator D1 is connected with a control terminal of the N-type MOS transistor, an input terminal of the N-type MOS transistor is connected with the driving chip 301, and an output terminal of the N-type MOS transistor is connected with the grounding wire.

When the driving chip 301 has a normal operating voltage, the reverse diode D2 has none of the static electricity, none of the static electricity passes through the first pin 1 and the second pin 3 of the current follower U1, correspondingly, none of the static electricity passes through the third pin 3, the fourth pin, and the first resistor R1. If a voltage value of the reverse input terminal of the comparator D1 is equal to a voltage value of the same-direction input terminal, the output terminal of the comparator D1 outputs a low level, the N-type MOS transistor is normally in a close state. When the reverse diode D2 is broken down to pass through partial current, the current passes through the first pin 1 and the second pin 2 corresponding to the primary side of the current follower U1, the current in the first pin 1 and the second pin 2 is increased, at this time, the current in the third pin 3 and the fourth pin is increased, the current comes from nothing, then the current is also generated on the first resistor R1 connected with the second logic high voltage VDD2, and a voltage drop on the first resistor R1 is a product of a current value of the third pin 3 and a resistance value of the first resistor R1, at this time, an input voltage value on the reverse input terminal of the comparator D1 is VVDD2−R1*I34, an input voltage value on the same-direction input terminal of the comparator D1 is VVDD1, a voltage value of the first logic high voltage VDD1 and a voltage value of the second logic high voltage VDD2 are equal, the input voltage value on the reverse input terminal of the comparator D1 is lower than the input voltage value on the same-direction input terminal of the comparator D1, the output terminal of the comparator D1 outputs a high level and is configured to turn on a grid electrode of the N-type MOS transistor, and the static electricity energy is discharged to the grounding wire through the input terminal and the output terminal of the N-type MOS transistor. When the static electricity energy is discharged to a certain extent, the reverse diode D2 cannot pass static electricity. The currents in the first pin 1 and the second pin2 of the current follower U1 are zero, correspondingly, the currents in the third pin 3 and the fourth pin are also zero, there is no current passing through the first resistor R1, thus, there is no voltage drop. The input voltage value on the reverse input terminal of the comparator D1 is VVDD2, the input voltage value on the same-direction input terminal of the comparator D1 is VVDD1, VVDD2=VVDD1, the output terminal of the comparator D1 outputs a low level, the grid electrode of the N-type MOS transistor is turned off, thus the operating current does not pass through the N-type MOS transistor, waiting for next high-energy static electricity generation, the N-type MOS transistor still turns on and off to provide stable and continuous static electricity protection for the driving chip. A main application scope of the static electricity protection device of the present scheme is for electrostatic discharge of high voltage and low current, which is high in current resistance, is not easy to damage, and is stable in electrostatic protection.

The technical solutions of the present disclosure are able to be widely used in various display panels, such as Twisted Nematic (TN) display panels, In-Plane Switching (IPS) display panels, Vertical Alignment (VA) display panels. display panels, and Multi-Domain Vertical Alignment (MVA) display panels. Certainly, the present disclosure are able to be widely used in other types of display panels, such as Organic Light-Emitting Diode (OLED) display panels, which is also able to be applies to the above embodiments The above content is a further detailed description of the present disclosure in conjunction with the specific preferred embodiments, and the specific implementation of the present disclosure is not limited to the description. It will be apparent to those skilled in the art that a number of simple deductions or substitutions may be made without departing from the conception of the present disclosure, which should be considered as being within the scope of the present disclosure.

What is claimed is:

1. A display panel static electricity protection device, comprising:
   a detection sub-circuit connected with a driving chip of a display panel;
   a discharge circuit connected with the detection sub-circuit and the driving chip;
   a current driving sub-circuit connected with the detection sub-circuit and the discharge circuit; and
   a discharge terminal connected with the discharge circuit and the current driving sub-circuit;
   wherein the detection sub-circuit is configured to detect static electricity, the current driving sub-circuit is configured to output and detect a current in the detection sub-circuit to open or close the discharge circuit; the static electricity is discharged to the discharge terminal through the discharge circuit and the current driving sub-circuit;
   wherein the current driving sub-circuit comprises:
   a first resistor;
   a comparator, wherein a same-direction input terminal of the comparator is connected with a first logic high voltage; a reverse input end of the comparator is connected with a second logic high voltage; an output terminal of the comparator is connected with a control terminal of the discharge circuit; and
   a current follower, wherein a first pin corresponding to a primary side of the current follower is connected with the detection sub-circuit, a second pin corresponding to the primary side of the current follower is connected with the discharge terminal; a third pin corresponding to a secondary side of the current follower is connected with both the first resistor and the reverse input terminal of the comparator; a fourth pin corresponding to the secondary side of the current follower is connected with the discharge terminal.

2. The display panel static electricity protection device according to claim 1, wherein the detection sub-circuit comprises a reverse diode; a cathode of the reverse diode is connected with the driving chip, and an anode of the reverse diode is connected with the first pin.

3. The display panel static electricity protection device according to claim 2, wherein a breakdown voltage value of the reverse diode is between 1.05 and 1.2 times a maximum operating voltage value of the driving chip.

4. The display panel static electricity protection device according to claim 1, wherein current flowing through the primary side is proportional to current flowing through the secondary side.

5. The display panel static electricity protection device according to claim 4, wherein the current flowing through the primary side is greater than current flowing through the secondary side.

6. The display panel static electricity protection device according to claim 4, wherein a voltage value of the first logic high voltage is equal to a voltage value of the second logic high voltage.

7. The display panel static electricity protection device according to claim 6, wherein the driving chip is a timing controller chip or a power chip.

8. The display panel static electricity protection device according to claim 1, wherein the discharge circuit comprises a semiconductor field effect transistor; an input terminal of the semiconductor filed effect transistor is connected with an output terminal of the driving chip, a control terminal of the semiconductor filed effect transistor is connected with the current driving sub-circuit, and an output terminal of the semiconductor field effect transistor is connected with the discharge terminal.

9. The display panel static electricity protection device according to claim 1, wherein the semiconductor filed effect transistor is an N-type transistor, the semiconductor filed effect transistor turns on when a control terminal signal is at a high level, and turns off when the control terminal signal is at a low level.

10. A static electrostatic protection method used for static electrostatic protection device of display panel, the static electrostatic protection device comprising a static electricity protection device comprising:
    a detection sub-circuit connected with a driving chip of a display panel;
    a discharge circuit connected with the detection sub-circuit and the driving chip;
    a current driving sub-circuit connected with the detection sub-circuit and the discharge circuit; and
    a discharge terminal connected with the discharge circuit and the current driving sub-circuit;
    wherein the current driving sub-circuit comprises: a first resistor; a comparator, wherein a same-direction input terminal of the comparator is connected with a first logic high voltage; a reverse input end of the comparator is connected with a second logic high voltage; an output terminal of the comparator is connected with a control terminal of the discharge circuit; and a current follower, wherein a first pin corresponding to a primary side of the current follower is connected with the detection sub-circuit, a second pin corresponding to the primary side of the current follower is connected with the discharge terminal; a third pin corresponding to a secondary side of the current follower is connected with both the first resistor and the reverse input terminal of the comparator; a fourth pin corresponding to the secondary side of the current follower is connected with the discharge terminal; wherein the detection sub-circuit is configured to detect static electricity, the current driving sub-circuit is configured to output and detect a current in the detection sub-circuit to open or close the discharge circuit; the static electricity is discharged to the discharge terminal through the discharge circuit and the current driving sub-circuit;

wherein the static electrostatic protection method comprises:

detecting whether an output terminal of the driving chip has static electricity by the detection sub-circuit;

opening the discharge circuit if the output terminal of the driving chip has the static electricity; and closing the discharge circuit if the output terminal of the driving chip has no static electricity.

11. A display device, comprising a display panel, a driving circuit board, and a display panel static electricity protection device comprising:

a detection sub-circuit connected with a driving chip of a display panel;

a discharge circuit connected with the detection sub-circuit and the driving chip;

a current driving sub-circuit connected with the detection sub-circuit and the discharge circuit; and a discharge terminal connected with the discharge circuit and the current driving sub-circuit;

wherein the detection sub-circuit is configured to detect static electricity, the current driving sub-circuit is configured to output and detect a current in the detection sub-circuit to open or close the discharge circuit; the static electricity is discharged to the discharge terminal through the discharge circuit and the current driving sub-circuit; the driving circuit board is connected with the display panel; the static electricity protection device is disposed on the driving circuit board;

wherein the current driving sub-circuit comprises:

a first resistor;

a comparator, wherein a same-direction input terminal of the comparator is connected with a first logic high voltage; a reverse input end of the comparator is connected with a second logic high voltage; an output terminal of the comparator is connected with a control terminal of the discharge circuit; and a current follower, wherein a first pin corresponding to a primary side of the current follower is connected with the detection sub-circuit, a second pin corresponding to the primary side of the current follower is connected with the discharge terminal; a third pin corresponding to a secondary side of the current follower is connected with both the first resistor and the reverse input terminal of the comparator; a fourth pin corresponding to the secondary side of the current follower is connected with the discharge terminal.

12. The display device according to claim 11, wherein the detection sub-circuit comprises a reverse diode; a cathode of the reverse diode is connected with the driving chip, and an anode of the reverse diode is connected with the first pin.

13. The display device according to claim 12, a breakdown voltage value of the reverse diode is between 1.05 and 1.2 times a maximum operating voltage value of the driving chip.

14. The display device according to claim 11, wherein the display panel comprises a display area, a non-display area, a source electrode thin film driving chip, and a gate electrode thin film driving chip; the driving circuit board comprises a driving chip and a connector, the driving circuit board is connected with the display panel, the non-display area surrounds the display area, the display area is configured to display pictures; the non-display area is connected with the source electrode thin film driving chip and the gate electrode thin film driving chip, the source electrode thin film driving chip is connected with the connector, the connector is connected with the driving chip; signals and power within the driving circuit board are transmitted to the display area through the connector, the source electrode thin film driving chip, the gate electrode thin film driving chip, and some wires.

15. The display device of the display panel according to claim 11, wherein the discharge terminal is connected to a grounding wire of the driving circuit board.

* * * * *